US 6,677,187 B2
Jan. 13, 2004

(12) United States Patent
Salaville

(54) PROCESS FOR ENCAPSULATING AN ELECTRICAL OR ELECTRONIC COMPONENT IN A SEALED MANNER

(75) Inventor: André Salaville, Grenoble (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 18 days.

(21) Appl. No.: 10/068,576

(22) Filed: Feb. 5, 2002

(65) Prior Publication Data

US 2002/0090803 A1 Jul. 11, 2002

Related U.S. Application Data

(62) Division of application No. 09/538,777, filed on Mar. 30, 2000, now Pat. No. 6,373,130.

(30) Foreign Application Priority Data

Mar. 31, 1999 (FR) .............................. 99 04219

(51) Int. Cl.⁷ ................... H01L 21/44; H01L 21/48; H01L 21/50
(52) U.S. Cl. .............. 438/125; 438/118; 438/127; 438/107
(58) Field of Search ................ 257/695, 698, 257/704, 737; 438/106, 116, 118, 119, 125, 126, 127, 51, 455, 456, 107

(56) References Cited

U.S. PATENT DOCUMENTS 5,166,773 A * 11/1992 Temple et al. ............. 257/678
5,369,057 A * 11/1994 Lee et al. .................. 438/51
5,448,014 A * 9/1995 Kong et al. ............... 174/52.3
5,479,703 A * 1/1996 Desai et al. ................ 29/852
5,578,869 A   11/1996 Hoffman et al.
5,610,431 A    3/1997 Martin

FOREIGN PATENT DOCUMENTS

| EP | 0505193 | 9/1992 |
| EP | 0609062 | 8/1994 |
| GB | 2310952 | 3/1997 |
| JP | 60263451 | 12/1985 |
| WO | WO 9517014 | 6/1995 |

* cited by examiner

Primary Examiner—Amir Zarabian
Assistant Examiner—Khanh Duong
(74) Attorney, Agent, or Firm—Heslin Rothenberg Farley & Mesiti P.C.; Victor A. Cardona

(57) ABSTRACT

An electrical or electronic component with sealed encapsulation includes a support for housing one or more electrical or electronic components from which electrically conducting tracks radiate towards a periphery of the support. Also included is a protective and sealing casing attached to the support and hermetically sealed with respect to the latter by a peripheral metal bead. A main part of the casing is intended to be placed opposite the support which is provided with hollow conducting elements passing through the thickness of the casing. Electrically conducting metal tracks radiate from external upper ends of the elements towards the periphery of the casing and the internal lower end of the elements are connected to at least one electrical connection track provided on the support via a metal hybridization ball.

5 Claims, 3 Drawing Sheets

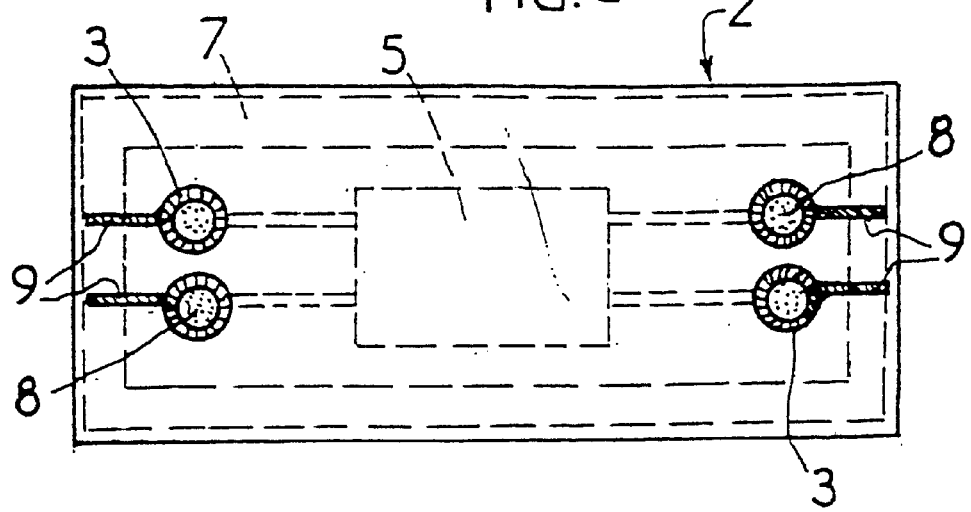
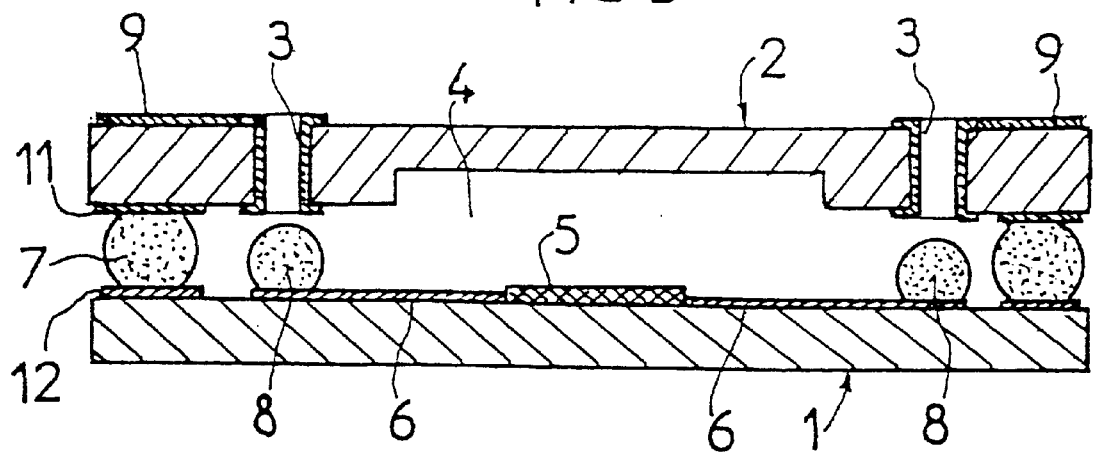

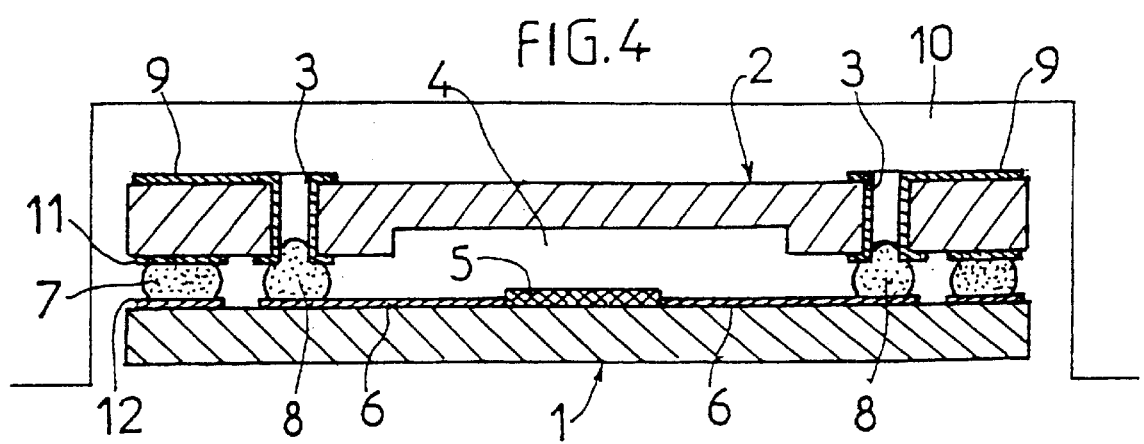
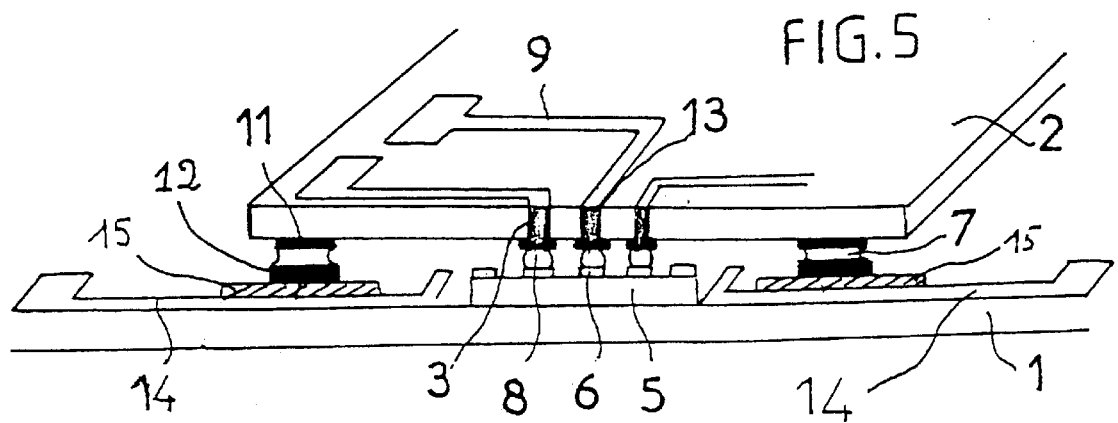

PROCESS FOR ENCAPSULATING AN ELECTRICAL OR ELECTRONIC COMPONENT IN A SEALED MANNER

CROSS REFERENCE TO RELATED APPLICATIONS

This application is a divisional of U.S. patent application Ser. No. 09/538,777, filed Mar. 30, 2000, now U.S. Pat. No. 6,373,130 which claims the priority of French application FR/99.04219, filed Mar. 31, 1999, the entire disclosure of which are incorporated herein by reference.

FIELD OF THE INVENTION

The invention relates to a novel electrical or electronic component provided with a sealed encapsulation system. It also relates to the process allowing it to be produced.

The field of the invention therefore relates more particularly to components and microcomponents, also having electronic chips, but also to microsensors, microactuators, etc.

BACKGROUND OF THE INVENTION

These microcomponents are conventionally deposited on a substrate of suitable nature, for example of the semiconductor (monocrystalline silicon, sapphire, etc.) type for electronic components. A number of electrically conducting tracks radiate from this microcomponent, towards the periphery of the substrate, so as to allow not only electrical supply to the component, if required, but also the processing and exploitation of the signals that it is called upon to generate, or even the control of the functions that it incorporates. Sometimes, a protective casing or cover is added to this component, suitable for preventing the problems inherently associated with impacts, with corrosion, with electromagnetic interference, etc., the said cover being attached, for example, by adhesive bonding. This cover may furthermore incorporate a window transparent to radiation to be detected by the said component or else a lens for focusing the said radiation onto the component.

Some of these microcomponents require for their operation to work under vacuum or in a controlled atmosphere (pressure, inert gas(es), etc.), or in a sealed manner with respect to the ambient atmosphere. Consequently, the aforementioned casing or cover is used so as to define a cavity above the said component, containing the suitable controlled atmosphere or the vacuum. The two technical concerns to be taken into consideration are therefore:

firstly, the hermeticity of the cover-component bond, intended to isolate the said component from the external agents, independently of the nature of the atmosphere then imprisoned in the volume thus defined;

secondly, the controlled nature of the atmosphere confined in the said volume, requiring that this atmosphere be distributed within this volume prior to sealing the cover onto the component.

Up to the present time, various techniques have been employed to thus allow the said electronic component to be encapsulated in a sealed manner. Among these, as described, for example, in the documents WO 95-17014 and GB-A-2, 310,952, is the use of a cover or lid, which is aligned with the support provided with its electronic component and which is soldered around the entire periphery of the said support. This soldering or sealing conventionally produces a metal/metal junction typically involving a soldered joint made of indium or of a tin/lead alloy.

Conventionally, this technique is carried out in two steps: it consists in aligning the cover with respect to the component, both being within a suitable enclosure so as to provide a controlled atmosphere or, if this is not the case, a vacuum chamber, depending on the atmosphere desired, and then in sealing the said cover onto the component using technologies perfectly known to those skilled in the art.

It may be readily appreciated that, since a multiplicity of these operations has to be carried out, or a multicomponent support has to be employed, the equipment intended to carry out these operations becomes very complex and very expensive to operate, given that all these operations must be conducted within the enclosure for maintaining the controlled atmosphere or for maintaining the vacuum, as already mentioned.

Production of such microcomponents requires increasing use of techniques similar to those in microelectronics, the said components being fabricated in a collective manner. However, these microcomponents fulfil increasingly sophisticated and complex functions requiring a corresponding increase in the connection technology intended to allow them to be used.

This is because these microcomponents require a large number of electrical inputs and outputs so as to make it possible, on the one hand, for them to operate and, on the other hand, for their effects to be exploited. This number of inputs and outputs requires an equal number of electrically conducting tracks, which tracks fan out towards the periphery of the support, because of a corresponding number of connection pads around the outside, leading as it were to a considerable increase in the area occupied just by the connection system. Paradoxically, the advances made in microelectronics make it possible to reduce the active part of the component proper. In other words, a significant part of the high-performance, and therefore expensive, material used, namely the substrate bearing the component, is assigned for the sole purpose of receiving the connection tracks.

Consequently, it may be readily appreciated that collective fabrication loses its effectiveness and that, in some cases, the superfluity of connections no longer makes it possible for them to be made on a single level. In addition, when a welded casing is required, the connections must be protected from the solder bead by the use of an insulating layer, generally called a passivation layer.

In order to cope with this increase in connections, it has been proposed to produce the stack of several connection levels by separating the said levels by an insulating passivation layer. However, although this passivation technique makes it possible to solve the problem at the immediate level of the component itself, it cannot, of course, deal with the solder pads intended for making the external connections. Furthermore, although this passivation technique is relatively well controlled, it does have quite a number of deficiencies, such as leaks, short circuits, etc., which affect the efficiencies. Finally, and above all, it involves additional steps in the production of the microcomponents and furthermore generates a larger amount of scrap since each step is associated with a not insignificant scrap level, consequently affecting the overall production cost of such microcomponents.

It has also been proposed, still with the objective of coping with this increase in connections, to transfer at least some of these connections to the protective cover or casing. Thus, in document EP-A-0,609,062, the cover includes several conducting tracks produced on its external face and electrically connected to the electronic component located inside the volume defined by the support/cover assembly via conducting penetrations. These conducting penetrations extend into the thickness of the said cover and are solid, so as to ensure sealing within the aforementioned volume.

Thus, although it becomes possible to increase the amount of connections by this means, the problem associated with confining a controlled atmosphere or a vacuum within the volume defined by the support/cover assembly still remains, especially in terms of simplicity of the installation and given the manufacturing cost of the components thus produced. The drawbacks here are in fact the same as those associated with the cover used in document WO 95/17014.

BRIEF SUMMARY OF THE INVENTION

The objective of the present invention is to solve these two main problems by proposing a device and a technology which are capable of significantly increasing the connection capacity of the component, especially for cases in which the severe environmental constraints dictate it, while still allowing effective encapsulation of the said component. Furthermore, the aim of the invention is, secondarily, to eliminate the need for passivation. However, in cases where there is a great need for connections, the invention makes it possible to provide both a standard level of connections on the substrate, within this passivated scenario, and a second level of connections on the casing.

This electrical or electronic component with sealed encapsulation comprises:

- a support intended to house one or more electrical or electronic components from which electrically conducting tracks radiate towards the periphery of the said support; and
- a protective and/or sealing casing attached to the said support and hermetically sealed with respect to the latter by means of a peripheral metal bead, the main part of the casing, intended to be placed opposite the said support, being provided with hollow conducting elements which pass right through the thickness of the said casing, from the (external) upper end of which elements electrically conducting metal tracks radiate towards the periphery of the casing, the internal lower end of which elements (with respect to the casing) being connected to at least one electrical connection track provided on the said support via a metal solder ball by hybridization.

In other words, one of the aspects of the invention consists in distributing all or some of the connections on the upper and therefore external face of the cover or casing, the transfer of these connections from the surface of the microcomponent to the casing being achieved by microballs, especially microballs made of indium or of tin/lead alloy, using the known technique of hybridization.

Hybridization by means of meltable microballs, generally made of indium or of tin/lead alloy, is well known for the production of collective electrical contacts for electrical components, whether the latter develop similar functions (stack of silicon circuits) or, on the contrary, greatly different functions (detection components on a read circuit, for example in the context of infrared detectors).

However, this technique has never been employed for the fitting of a protective casing provided with sufficient solid and sealed conducting penetrations when only hermeticity is desired in conjunction with the production of an upper level of connections on the casing, or of contact pads or plated through-holes, freeing an access for conveying the controlled atmosphere into the cavity thus defined, when, furthermore, it is simultaneously accompanied by the production of such a controlled atmosphere by the melting of a peripheral solder bead.

According to one advantageous characteristic of the invention, the metal solder balls are made of the same material as the peripheral solder bead.

According to another characteristic of the invention, the conducting elements provided through the main part of the casing consist exclusively of plated through-holes, the lower base of which is intended to come into intimate contact, for hermetic soldering, with the said balls or microballs after the peripheral solder bead has melted. This embodiment thus has the advantage of establishing, before the said casing is sealed onto the support, a controlled atmosphere or vacuum within the cavity defined by the casing and the support, the lower end of the said through-holes not being in contact with the solder balls before sealing.

According to the invention, the casing or cover may be equipped, depending on the case, with a transparent window or even with a radiation-focusing lens, or with any other member capable of fulfilling a simple technical function.

The invention also relates to the process for producing such a component.

This process consists:

firstly in placing, around a support having an electrical or electronic component provided with electrically conducting tracks which radiate towards its periphery, a continuous sealing bead made of a metal or a metal alloy having a low melting point, all or some of the said tracks stopping short of the said bead;

then, at the end of the said conducting tracks, in placing microballs which are made of a metallic material and have a diameter smaller than the diameter or the thickness of the said bead;

then in positioning, on the support thus produced, a casing or cover of suitable dimensions, the upper face of which, intended to be placed opposite the said support, is provided with hollow conducting elements which pass right through the said face and are located vertically above the said microballs, and is provided with conducting metal tracks extending from the upper end of the said conducting elements towards the periphery of the said cover, the said cover resting on the peripheral sealing bead; and finally, in raising the temperature of the enclosure within which the assembly thus formed is positioned so as to melt the materials of which the peripheral sealing bead and the microballs are composed, causing, on the one hand, the lowering of the said cover towards the support and, as a corollary, its peripheral hermetic sealing to the said support suitable for ensuring that the internal volume thus defined is peripherally sealed with respect to the outside and, on the other hand, the soldering of the said microballs at the lower end of the conducting through-elements in such a way as to ensure that there is electrical continuity between the conducting tracks on the support and those on the cover or casing and that the volume thus defined is sealed.

Advantageously, the hollow conducting through-elements consist of plated through-holes and the temperature rise within the enclosure results in the melting and the hermetic soldering of each of the microballs within the said holes.

BRIEF DESCRIPTION OF THE DRAWINGS

The manner in which the invention may be realized and the advantages which stem therefrom will be better appreciated from the illustrative embodiment which follows, given by way of non-limiting indication, supported by the appended figures.

FIG. 2 is a schematic top view of the component according to the invention.

FIG. 3 is a cross-sectional view showing the preparation step prior to the soldering operation.

FIG. 4 is a similar view when the sealing operations have been completed.

FIG. 5 is a perspective schematic illustration of the casing/support assembly obtained after sealing.

DETAILED DESCRIPTION OF THE INVENTION

Figure 1:
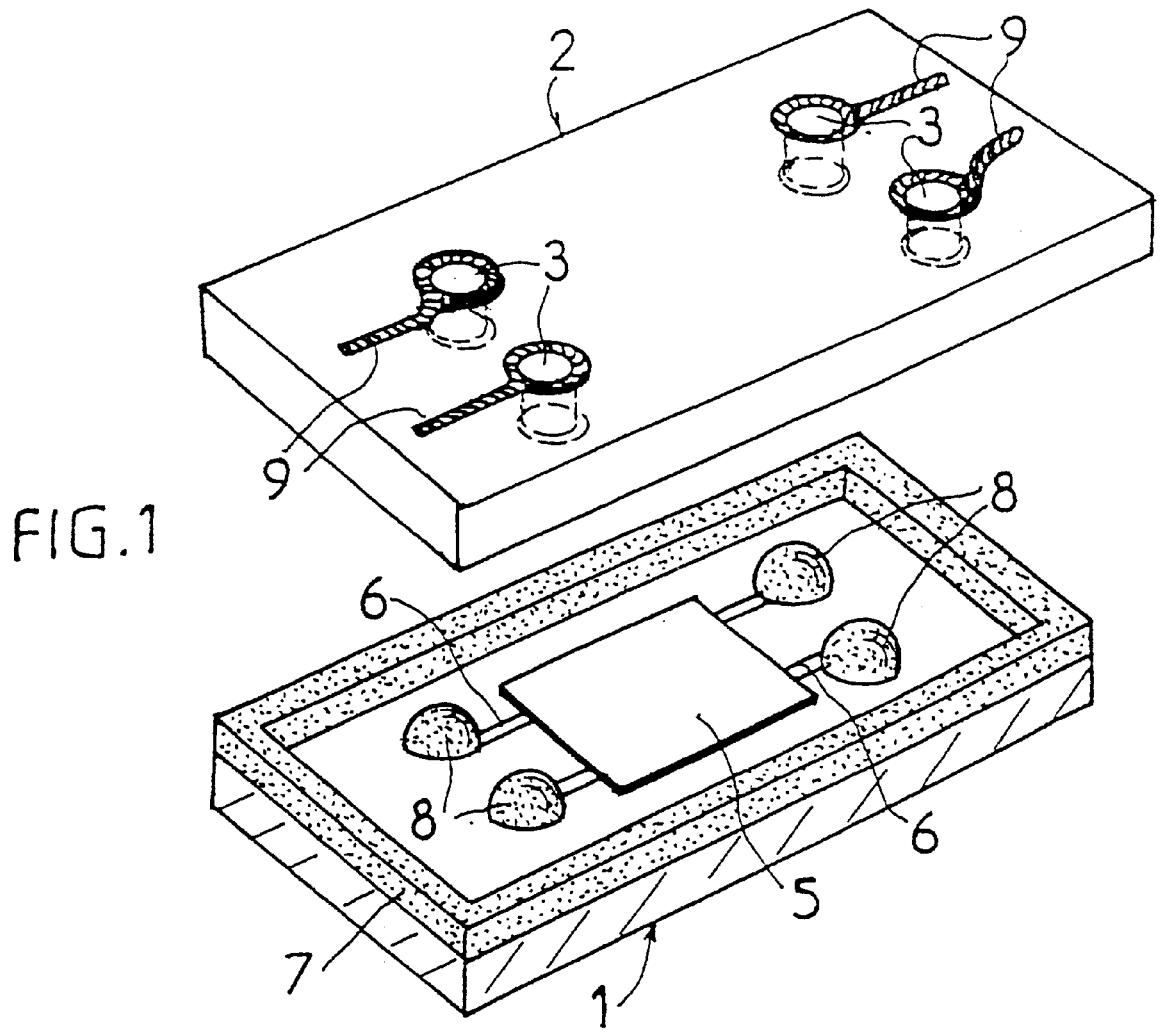
FIG. 1 is an exploded perspective schematic illustration of the elements involved in the composition of the component according to the invention, prior to the sealing operation.

FIG. 1 illustrates schematically an exploded perspective view of a component according to the invention prior to its final production, that is to say prior to the step of joining a protective cover or casing (2) to a support (1), and in which a controlled atmosphere or a vacuum is necessary for the proper operation of the said component.

This support (1) consists of a substrate, for example made of silicon or of alumina or any other conventional material for assembling microcomponents, on the upper face of which support an electrical or electronic component (5), which may be multifunctional, is placed. It may, for example, be a sensor or microsensor, especially for detecting radiation, but also an accelerometer, a bolometer, activators or microactivators, etc.

As is known, the operation and exploitation of these components require the conveyance and processing of electrical signals, the said signals traveling along electrically conducting tracks (6) extending from the point where the component is fitted on the substrate towards the periphery of the said support (1).

Furthermore, it is often preferable to protect these components from external influences and some of them need, even absolutely necessarily, to operate in a controlled atmosphere and, for example, at specific pressures, or even in the presence of an inert gas or of a specific gas, or else must operate in a vacuum, such as cooled components.

To do this, the support (1) is surmounted by a cover or casing (2) hermetically sealed to the support (1) and thus defining a cavity (4) which is isolated from the outside and has the characteristics suitable for allowing the component (5) to operate.

This casing (2) may be provided with a transparent window (not illustrated), especially one which is transparent to certain radiation bands such as, for example, the infrared band when the component (5) is an infrared detector. This window may even consist of a lens suitable for focusing the radiation thus captured onto the component (5).

The casing (2) is fastened to the support (1) employing a known metal/metal soldering technology, making use of a continuous peripheral joint or bead (7), typically made of indium or a tin/lead alloy, or any other low-temperature solder alloy.

For this purpose, this bead is deposited on a wettability area (12), illustrated in FIGS. 3 and 4, for example based on a titanium/nickel/gold three-layer stack produced, for example, by deposition and photolithography, or any other thin-film metal stack conventional in the field of microelectronics.

The same wettability areas (11) are also present on the casing on its lower face, these being located, of course, so as to face the bead (7). Optionally, they are produced in the same way and from the same material, although this feature is not an essential characteristic.

The casing (2) is made of an electrically insulating material, or a semiconductor such as silicon or germanium.

According to a first embodiment of the invention, the lower (internal) face of the main part of the casing (2), intended to be placed opposite the support (1), is provided with hollow through-holes (3), the internal surface of which is plated, so as to allow electrical conduction, the plating furthermore extending slightly beyond the internal face of the said casing, as may be clearly seen in FIGS. 3 and 4. These through-holes are located in such a way that they lie vertically above approximately the end of the conducting metal tracks (6) produced on the support (1). More specifically, these plated holes (3) are intended to cooperate with microballs (8) made, for example, of the same material as the constituent material of the sealing bead (7).

The upper end of the through-holes (3) on the external surface of the said main part of the casing is in intimate contact with the start of metal conducting tracks (9), as may be clearly seen in FIGS. 1 and 2, the said tracks extending, in particular, towards the periphery of the said casing as far as the connection pads.

In this way, the casing (2), apart from its role of protection and also, in conjunction with the support (1), of defining a sealed cavity (4) capable of containing either a controlled atmosphere or a vacuum, constitutes a connection relay more particularly appreciable when microcomponents (5) requiring complex connections are used.

FIG. 3 illustrates the step of producing a component according to the invention, after the step illustrated in FIG. 1. In FIG. 3, the casing (2) is positioned on the support (1) and rests via the wettability area (11) on the sealing bead (7) placed beforehand on the support (1).

This positioning step is carried out in a strict manner so as to make the through-holes (3) coincide with the microballs (8). In this regard, it should be noted that the diameter of these microballs is less than the diameter or the thickness of the sealing bead (7). Furthermore, although the latter has been illustrated schematically with a square or rectangular cross section in FIG. 1, it may also have a substantially circular or semicircular cross section.

The positioning operation is carried out either automatically, by means of a suitable machine known as operation has been carried out, either an enclosure (10) is brought over the component(s), or the component(s) are brought into the enclosure. According to another alternative, the positioning is carried out within this enclosure (10). Whatever the case, this enclosure (10) is closed and the desired atmosphere within the cavity (4) is produced, that is to say either a controlled atmosphere or, on the contrary, a high vacuum.

The temperature within the enclosure (10) is then raised sufficiently to melt the constituent material(s) of the sealing bead (7) and of the microballs (8), respectively. The respective dimensions of the bead (7) and of the microballs (8), as well as those of the wettability areas, especially (11) and (12), are chosen in such a way that this melting causes the cover or casing (2) to be lowered in the direction of the support (1) sufficiently, on the one hand, to cause the melted microballs (8) to come into contact with the metallization produced within the through-holes (3) and, on the other hand, to cause the said microballs (8) to be soldered to the holes (3), as may futhermore be clearly seen in FIG. 4.

Apart from sealed and effective soldering of the casing (2) to the support (1) around the bead (7), as well as at the microballs (8), electrical continuity between the tracks (6) on the support (1) and the tracks (9) on the casing (2) is consequently obtained, thus allowing effective operation of the component (5).

FIG. 5 illustrates conducting tracks (14) extending beyond the cover, as well as the passivation layer (15) which is then necessary.

All the advantages of the invention are therefore readily appreciated in so far as, apart from the possibility of dispensing with the additional passivation step described in the preamble, given that all the connections on the support (1) may be located set back from the sealing bead, particular benefit is derived from an additional connection stage, thus making it possible to safeguard high-performance material (the support (1)) while at the same time making it possible to increase the complexity of the actual component. In this way, the reduction in the size of these components is again optimized.

It should above all be emphasized that the process according to the invention makes it possible to carry out two functions—respectively the sealed closure of the component and the implementation of a second connection stage—in a single operation, by the use of hollow, plated through-holes, furthermore saving time and simplifying the operations.

According to the invention, one or more well-known getter devices may be positioned in the cavity when the latter is under vacuum.

It goes without saying that the size of the integral device may be very close to the size of the active component, thus as it were optimizing the space saving by decreasing the footprint.

What is claimed is:

1. Process for producing an electrical or electronic component with sealed encapsulation comprising:

placing, around a support (1) having an electrical or electronic component (5) provided with first electrically conducting tracks (6) radiating towards a periphery of said support, a continuous sealing bead (7) made of at least one metal having a low melting point, at least some of said first electrically conducting tracks (6) stopping short of said bead (7);

placing microballs at an end of at least some of the first electrically conducting tracks, said microballs being made of said at least one metal having a low melting point, and having a diameter smaller than a diameter of said bead;

positioning, on the support (1) a casing of suitable dimensions, having a main part, said main part having an internal face placeable opposite said support, and provided with hollow conducting elements (3) passing through a thickness of said main part and located vertically above said microballs (8), said casing being provided with second electrically conducting metal tracks (9) extending from an upper end of said hollow conducting elements towards a periphery of said casing, the periphery of said casing resting on said bead (7);

positioning and enclosure around said casing and said support; and raising the temperature within the enclosure (10);

wherein said at least one metal is melted, said casing (2) is lowered towards the support (1) and hermetically sealed to said support defining an internal volume (4) sealed with respect to the outside and said microballs (8) are soldered to a lower end of the hollow conducting elements (3) in such a way as to ensure that there is electrical continuity between the first electrically conducting tracks (6) and the second electrically conducting tracks.

2. Process for producing an electrical or electronic component with sealed encapsulation according to claim 1, characterized in that the hollow conducting elements comprise plated through-holes (3) and in that raising the temperature within the enclosure (10) results in melting of each of the microballs (8) within said through-holes and hermetic soldering to metallization of said through-holes.

3. Process for producing an electrical or electronic component with sealed encapsulation according to claim 1, characterized in that the metal layers forming wettability areas (11, 12) are placed on the support (1) and an inner face of the case (2) vertically in line with a region for housing the sealing bead (7) and the microballs (8).

4. Process tar producing an electrical or electronic component with sealed encapsulation according to claim 2, characterized in that metal layers forming wettability areas (11, 12) are placed on the support (1) and an inner face of the casing (2) vertically in line with a region for housing the sealing bead (7) and the microballs (8).

5. A process for producing an electrical or electronic component with sealed encapsulation according to claim 2, characterized in that metal layers farming wettability areas (11, 12) are placed on the support (1) and an inner face of the casing (2) vertically in line with a region for housing the sealing bead (7) and the microballs (8).

* * * * *

UNITED STATES PATENT AND TRADEMARK OFFICE
CERTIFICATE OF CORRECTION

PATENT NO.   : 6,677,187 B2
DATED        : January 13, 2004
INVENTOR(S)  : Salaville It is certified that error appears in the above-identified patent and that said Letters Patent is hereby corrected as shown below:

<u>Column 8,</u>
Line 37, delete the word "tar" and insert -- for --

Signed and Sealed this

Sixth Day of April, 2004

JON W. DUDAS
*Acting Director of the United States Patent and Trademark Office*